US012796479B2

(12) United States Patent
Ni et al.

(10) Patent No.: US 12,796,479 B2
(45) Date of Patent: Nov. 10, 2026

(54) SEMICONDUCTOR STRUCTURE

(71) Applicant: Powerchip Semiconductor Manufacturing Corporation, Hsinchu (TW)

(72) Inventors: Pei-Rong Ni, Hsinchu (TW); Chun-Lin Lu, Hsinchu City (TW); Shou-Zen Chang, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 378 days.

(21) Appl. No.: 18/620,984

(22) Filed: Mar. 28, 2024

(65) Prior Publication Data

US 2025/0285996 A1 Sep. 11, 2025

(30) Foreign Application Priority Data

Mar. 6, 2024 (TW) ................................ 113108237

(51) Int. Cl.

*H10W 44/00* (2026.01)
*H10W 70/60* (2026.01)
*H10W 70/63* (2026.01)
*H10W 70/685* (2026.01)
*H10W 90/00* (2026.01)

(52) U.S. Cl.

CPC ........ *H10W 44/601* (2026.01); *H10W 70/611* (2026.01); *H10W 70/635* (2026.01); *H10W 70/685* (2026.01); *H10W 90/724* (2026.01)

(58) Field of Classification Search

CPC ............. H10W 44/601; H10W 70/611; H10W 70/635; H10W 70/685; H10W 90/724; H10W 90/401; H10W 70/698; H10W 90/701

See application file for complete search history.

(56) References Cited

U.S. PATENT DOCUMENTS

| | | | | |
|---|---|---|---|---|
| 10,504,877 | B2 | 12/2019 | Hsieh et al. | |
| 11,742,220 | B2 | 8/2023 | Hsu et al. | |
| 2020/0212033 | A1* | 7/2020 | Chung | H10D 89/819 |
| 2023/0282614 | A1 | 9/2023 | Hsieh et al. | |
| 2024/0063130 | A1 | 2/2024 | Chen et al. | |
| 2024/0071936 | A1* | 2/2024 | Ling | H10W 70/05 |

FOREIGN PATENT DOCUMENTS

| | | |
|---|---|---|
| TW | 202203335 | 1/2022 |
| TW | 202243169 | 11/2022 |
| TW | 202245159 | 11/2022 |

OTHER PUBLICATIONS

Kai Zoschke et al., "Fabrication of Application Specific Integrated Passive Devices Using Wafer Level Packaging Technologies", IEEE Transactions on Advanced Packaging, Sep. 2007, pp. 1-9.

"Office Action of Taiwan Counterpart Application", issued on Nov. 22, 2024, p. 1-p. 11.

* cited by examiner

*Primary Examiner* — Julia Slutsker
(74) *Attorney, Agent, or Firm* — JCIPRNET

(57) ABSTRACT

A semiconductor structure including an interposer is provided. The interposer includes a substrate, a redistribution layer (RDL), a first integrated passive device (IPD), and a second IPD. The RDL is located on the substrate. The first IPD is located in the substrate. The second IPD is located in the RDL.

16 Claims, 3 Drawing Sheets

SEMICONDUCTOR STRUCTURE

CROSS-REFERENCE TO RELATED APPLICATION

This application claims the priority benefit of Taiwan application serial no. 113108237, filed on Mar. 6, 2024. The entirety of the above-mentioned patent application is hereby incorporated by reference herein and made a part of specification.

BACKGROUND

Technical Field

The invention relates to a semiconductor structure, and particularly relates to a semiconductor structure including an integrated passive device (IPD).

Description of Related Art

Currently, the IPD is widely used in the semiconductor structure, and the IPD is mounted on the interposer and next to the main die. Since the IPD occupies the area on the interposer used for mounting the die, the degree of freedom and the flexibility of the package design will be reduced.

SUMMARY

The invention provides a semiconductor structure, which can improve the degree of freedom and the flexibility of the package design.

The invention provides a semiconductor structure, which includes an interposer. The interposer includes a substrate, a redistribution layer (RDL), a first integrated passive device (IPD), and a second IPD. The RDL is located on the substrate. The first IPD is located in the substrate. The second IPD is located in the RDL.

According to an embodiment of the invention, in the semiconductor structure, the first IPD and the second IPD may be electrically connected to each other.

According to an embodiment of the invention, in the semiconductor structure, the first IPD and the second IPD may be connected in series.

According to an embodiment of the invention, in the semiconductor structure, the first IPD and the second IPD may be connected in parallel.

According to an embodiment of the invention, in the semiconductor structure, the first IPD and the second IPD may be electrically insulated from each other.

According to an embodiment of the invention, in the semiconductor structure, the first IPD and the second IPD may be separated from each other.

According to an embodiment of the invention, in the semiconductor structure, the second IPD may overlap the first IPD.

According to an embodiment of the invention, in the semiconductor structure, the second IPD does not overlap the first IPD.

According to an embodiment of the invention, in the semiconductor structure, the first IPD may be a capacitor.

According to an embodiment of the invention, in the semiconductor structure, the second IPD may be a capacitor.

According to an embodiment of the invention, in the semiconductor structure, the RDL may include a dielectric layer, an interconnect structure, and a pad. The dielectric layer is located on the substrate. The interconnect structure is located in the dielectric layer. The pad is located above the interconnect structure and is located in the dielectric layer.

According to an embodiment of the invention, in the semiconductor structure, the first IPD may be electrically connected to the interconnect structure.

According to an embodiment of the invention, in the semiconductor structure, the second IPD may be electrically connected to the interconnect structure.

According to an embodiment of the invention, in the semiconductor structure, the second IPD may be located in the dielectric layer.

According to an embodiment of the invention, in the semiconductor structure, the dielectric layer may include a first surface and a second surface opposite to each other. The first surface may be adjacent to the substrate.

According to an embodiment of the invention, in the semiconductor structure, the first IPD and the second IPD may be adjacent to the first surface. The pad may be adjacent to the second surface.

According to an embodiment of the invention, the semiconductor structure may further include a die. The die is located on the second surface. The die may be electrically connected to the pad.

According to an embodiment of the invention, the semiconductor structure may further include a connection terminal. The connection terminal is located between the die and the pad.

According to an embodiment of the invention, in the semiconductor structure, the interposer may further include a through-substrate via (TSV). The TSV passes through the substrate.

According to an embodiment of the invention, in the semiconductor structure, the TSV may extend into the dielectric layer.

Based on the above description, in the semiconductor structure according to the invention, the first IPD is located in the substrate, and the second IPD is located in the RDL. Therefore, the first IPD and the second IPD do not occupy the area on the interposer used for mounting the die. In this way, the degree of freedom and the flexibility of the package design can be improved, and the difficulty and the cost of the back end package process can be reduced.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention.

For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
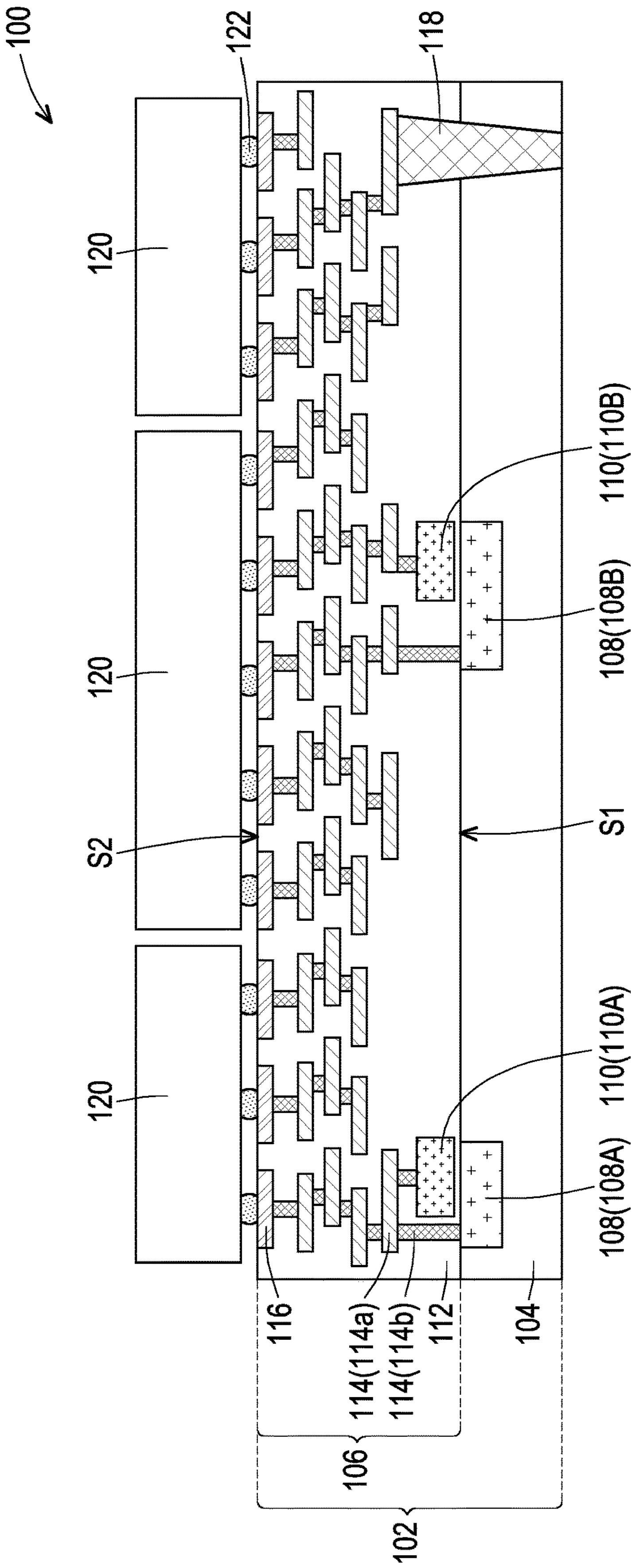
FIG. 1 is a cross-sectional view of a semiconductor structure according to some embodiments of the invention.
Figure 2:
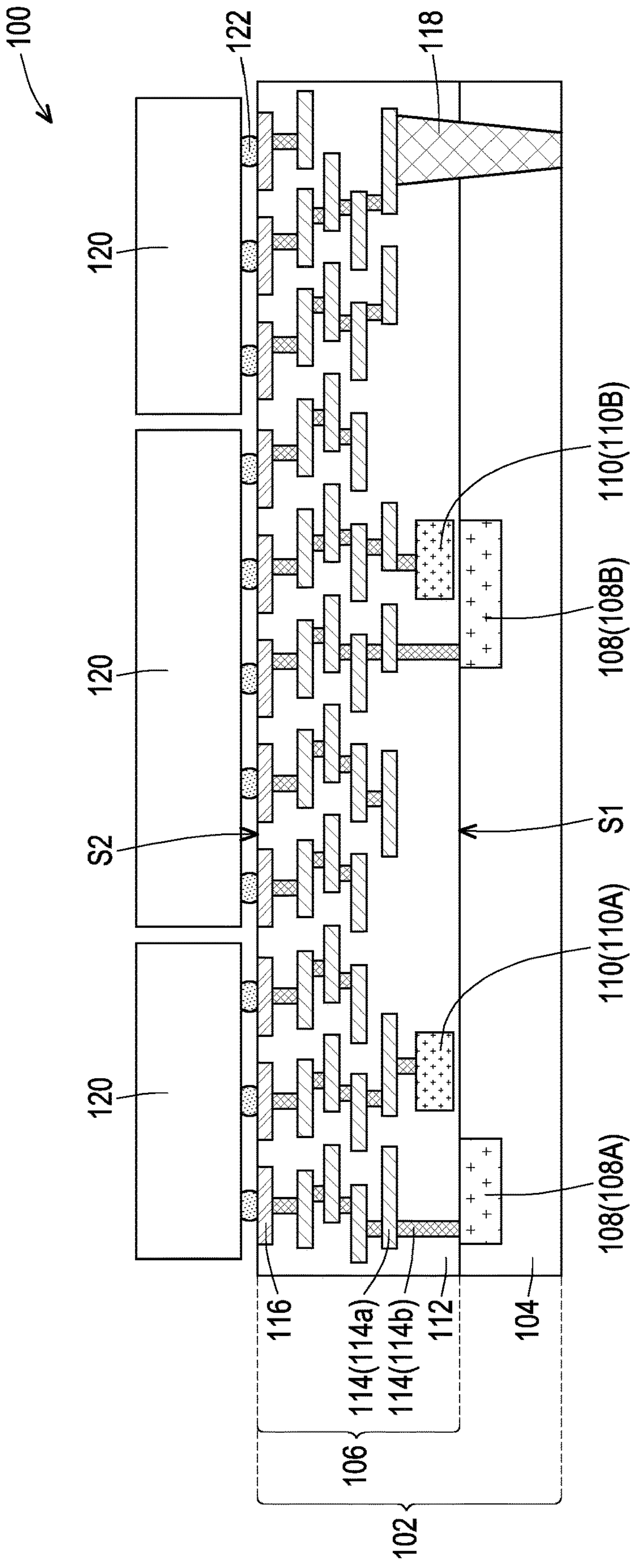
FIG. 2 is a cross-sectional view of a semiconductor structure according to other embodiments of the invention.
Figure 3:
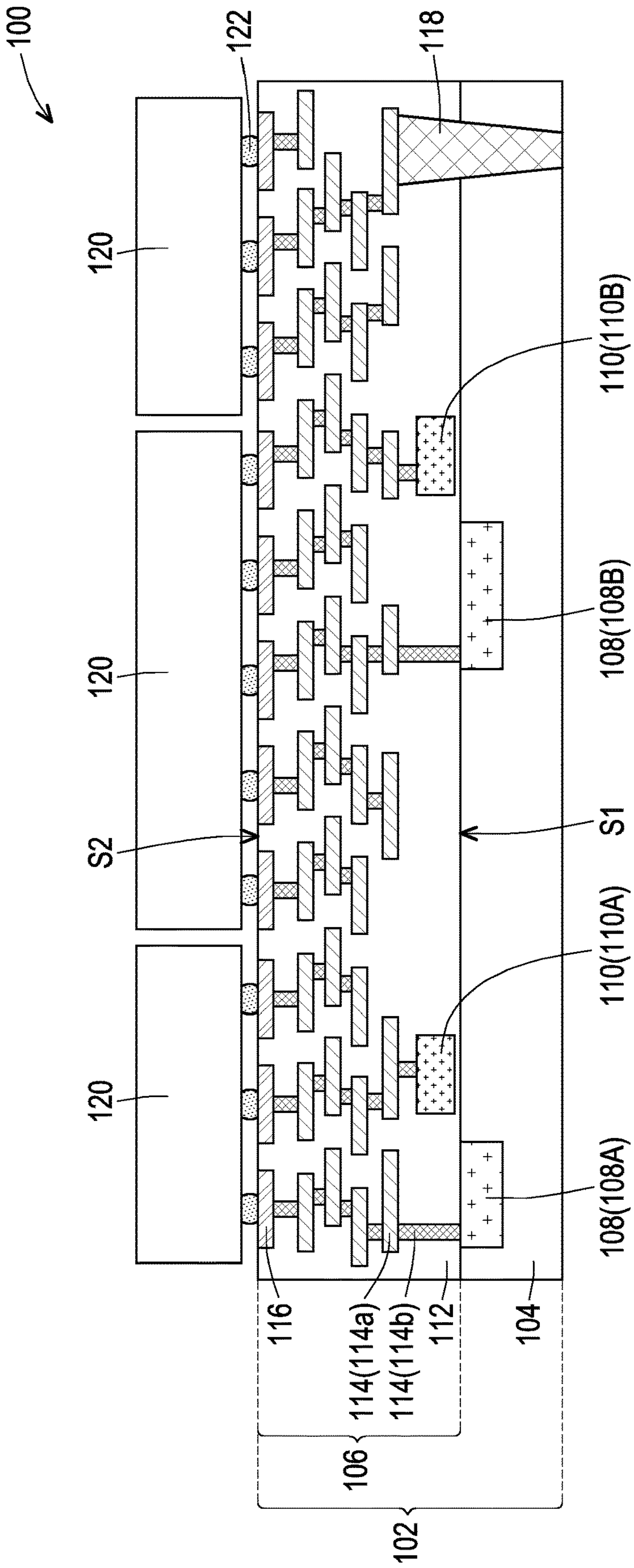
FIG. 3 is a cross-sectional view of a semiconductor structure according to other embodiments of the invention.

FIG. 1 is a cross-sectional view of a semiconductor structure according to some embodiments of the invention. FIG. 2 is a cross-sectional view of a semiconductor structure according to other embodiments of the invention. FIG. 3 is a cross-sectional view of a semiconductor structure according to other embodiments of the invention.

Referring to FIG. 1A to FIG. 3, a semiconductor structure 100 includes an interposer 102. In some embodiments, the interposer 102 may be a silicon interposer (Si-interposer). The interposer 102 includes a substrate 104, a redistribution layer (RDL) 106, an integrated passive device (IPD) 108, and an IPD 110. In some embodiments, the substrate 104 may be a semiconductor substrate such as a silicon substrate.

The RDL 106 is located on the substrate 104. The RDL 106 may include a dielectric layer 112, an interconnect structure 114, and a pad 116. The dielectric layer 112 is located on the substrate 104. The dielectric layer 112 may include a first surface S1 and a second surface S2 opposite to each other. The first surface S1 may be adjacent to the substrate 104. In some embodiments, the dielectric layer 112 may be a multilayer structure. In some embodiments, the material of the dielectric layer 112 is, for example, silicon oxide, silicon nitride, or a combination thereof. The interconnect structure 114 is located in the dielectric layer 112. The interconnect structure 114 may include a conductive line 114*a*, a plug 114*b*, or a combination thereof. In some embodiments, the plug 114*b* may be a contact plug or a via plug. In some embodiments, the material of the interconnect structure 114 is, for example, copper, aluminum, tungsten, tantalum, tantalum nitride, titanium, titanium nitride, or a combination thereof. The pad 116 is located above the interconnect structure 114 and is located in the dielectric layer 112. The pad 116 may be adjacent to the second surface S2. The pad 116 may be electrically connected to the corresponding interconnect structure 114. The material of the pad 116 is, for example, a conductive material such as metal (e.g., copper, aluminum, or tungsten).

The IPD 108 is located in the substrate 104. That is, IPD 108 may be embedded in the substrate 104. The IPD 108 may be adjacent to the first surface S1. The IPD 108 may be electrically connected to the interconnect structure 114. In some embodiments, the IPD 108 may be a capacitor. In some embodiments, the IPD 108 is, for example, a trench capacitor.

The IPD 110 is located in the RDL 106. That is, the IPD 110 may be embedded in the RDL 106. Since the IPD 108 is located in the substrate 104, and the IPD 110 is located in the RDL 106, the IPD 108 and the IPD 110 do not occupy the area on the interposer 102 used for mounting the die. In some embodiments, the IPD 110 may be located in the dielectric layer 112. The IPD 110 may be adjacent to the first surface S1. The IPD 110 may be electrically connected to the interconnect structure 114. The IPD 108 and the IPD 110 may be separated from each other. In some embodiments, the IPD 108 and the IPD 110 may be separated from each other by the dielectric layer 112. In some embodiments, the IPD 110 may be a capacitor. In some embodiments, the IPD 110 is, for example, a trench capacitor.

In some embodiments, as shown in FIG. 1, the IPD 108A and the IPD 110A may be electrically connected to each other, but the invention is not limited thereto. In other embodiments, as shown in FIG. 2 and FIG. 3, the IPD 108A and the IPD 110A may be electrically insulated from each other. In some embodiments, as shown in FIG. 1, the IPD 108A and the IPD 110A may be electrically connected to each other by the interconnect structure 114. In some embodiments, the IPD 108A and the IPD 110A may be connected in series. In some embodiments, the IPD 108A and the IPD 110A may be connected in parallel. In some embodiments, as shown in FIG. 1, the IPD 108A and the IPD 110A may be connected in series or in parallel by the interconnect structure 114.

In some embodiments, as shown in FIG. 1 to FIG. 3, the IPD 108B and the IPD 110B may be electrically insulated from each other, but the invention is not limited thereto. In other embodiments, although not shown in the figure, the IPD 108B and the IPD 110B may be electrically connected to each other.

In some embodiments, as shown in FIG. 1, the IPD 110A may overlap the IPD 108A, and the IPD 110B may overlap the IPD 108B. In other embodiments, as shown in FIG. 2, the IPD 110A does not overlap the IPD 108A, and the IPD 110B may overlap the IPD 108B. In other embodiments, as shown in FIG. 3, the IPD 110A does not overlap the IPD 108A, and the IPD 110B does not overlap IPD the 108B.

The interposer 102 may further include a through-substrate via (TSV) 118. The TSV 118 passes through the substrate 104. The TSV 118 may extend into the dielectric layer 112. The TSV 118 may be electrically connected to the corresponding interconnect structure 114. In some embodiments, the material of the TSV 118 is, for example, copper, tantalum, tantalum nitride, or a combination thereof.

The semiconductor structure 100 may further include a die 120. The die 120 is located on the second surface S2. The die 120 may be electrically connected to the pad 116. In some embodiments, the die 120 may be a high bandwidth memory (HBM) die or a system on chip (SOC) die. When the number of the dies 120 is plural, the dies 120 may include HBM dies, SOC dies, or combinations thereof.

The semiconductor structure 100 may further include a connection terminal 122. The connection terminal 122 is located between the die 120 and the pad 116. The die 120 may be electrically connected to the pad 116 by the connection terminal 122. In some embodiments, the IPD 108 may be electrically connected to the corresponding die 120 by the corresponding interconnect structure 114, the corresponding pad 116, and the corresponding connection terminal 122. In some embodiments, the IPD 110 may be electrically connected to the corresponding die 120 by the corresponding interconnect structure 114, the corresponding pad 116, and the corresponding connection terminal 122. The connection terminal 122 may be a bump (e.g., solder ball), but the invention is not limited thereto.

Based on the above embodiments, in the semiconductor structure 100, the IPD 108 is located in the substrate 104, and the IPD 110 is located in the RDL 106. Therefore, the IPDs do not occupy the area on the interposer 102 used for mounting the die 120. In this way, the degree of freedom and the flexibility of the package design can be improved, and the difficulty and the cost of the back end package process can be reduced.

In summary, in the semiconductor structure of the aforementioned embodiments, since the IPD does not occupy the area on the interposer used for mounting the die, the degree of freedom and the flexibility of the package design can be improved, and the difficulty and the cost of the back end package process can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:

an interposer comprising:

a substrate;

a redistribution layer (RDL) located on the substrate;

a first integrated passive device (IPD) located in the substrate; and a second IPD located in the RDL, wherein the first IPD and the second IPD are electrically insulated from each other.

2. The semiconductor structure according to claim 1, wherein the first IPD and the second IPD are separated from each other.

3. The semiconductor structure according to claim 1, wherein the second IPD overlaps the first IPD.

4. The semiconductor structure according to claim 1, wherein the second IPD does not overlap the first IPD.

5. The semiconductor structure according to claim 1, wherein the first IPD comprises a capacitor.

6. The semiconductor structure according to claim 1, wherein the second IPD comprises a capacitor.

7. The semiconductor structure according to claim 1, wherein the RDL comprises:

a dielectric layer located on the substrate;

an interconnect structure located in the dielectric layer; and a pad located above the interconnect structure and located in the dielectric layer.

8. The semiconductor structure according to claim 7, wherein the first IPD is electrically connected to the interconnect structure.

9. The semiconductor structure according to claim 7, wherein the second IPD is electrically connected to the interconnect structure.

10. The semiconductor structure according to claim 7, wherein the second IPD is located in the dielectric layer.

11. The semiconductor structure according to claim 7, wherein the dielectric layer comprises a first surface and a second surface opposite to each other, and the first surface is adjacent to the substrate.

12. The semiconductor structure according to claim 11, wherein the first IPD and the second IPD are adjacent to the first surface, and the pad is adjacent to the second surface.

13. The semiconductor structure according to claim 11, further comprising:

a die located on the second surface and electrically connected to the pad.

14. The semiconductor structure according to claim 13, further comprising:

a connection terminal located between the die and the pad.

15. The semiconductor structure according to claim 7, wherein the interposer further comprises:

a through-substrate via (TSV) passing through the substrate.

16. The semiconductor structure according to claim 15, wherein the TSV extends into the dielectric layer.

* * * * *